(12) United States Patent
Fujioka et al.

(10) Patent No.: US 12,125,927 B2
(45) Date of Patent: Oct. 22, 2024

(54) SOLAR CELL AND ELECTRONIC DEVICE HAVING THE SAME

(71) Applicant: TDK Corporation, Tokyo (JP)

(72) Inventors: Hirokazu Fujioka, Tokyo (JP); Kouji Imazawa, Tokyo (JP); Kouhei Nakanishi, Tokyo (JP)

(73) Assignee: TDK Corporation, Tokyo (JP)

( * ) Notice: Subject to any disclaimer, the term of this patent is extended or adjusted under 35 U.S.C. 154(b) by 101 days.

(21) Appl. No.: 18/006,581

(22) PCT Filed: May 18, 2021

(86) PCT No.: PCT/JP2021/018729
§ 371 (c)(1),
(2) Date: Jan. 24, 2023

(87) PCT Pub. No.: WO2022/024504
PCT Pub. Date: Feb. 3, 2022

(65) Prior Publication Data
US 2023/0275166 A1 Aug. 31, 2023

(30) Foreign Application Priority Data

Jul. 27, 2020 (JP) ................................. 2020-126586

(51) Int. Cl.
*H01L 31/0465* (2014.01)

(52) U.S. Cl.
CPC ................................. *H01L 31/0465* (2014.12)

(58) Field of Classification Search
CPC ............................. H02S 30/00; H01L 31/0465
See application file for complete search history.

(56) References Cited

U.S. PATENT DOCUMENTS

| 6,791,905 B1 | 9/2004 | Sekiguchi | |
| 2013/0316486 A1* | 11/2013 | Lunch | H01L 31/02008 438/62 |
| 2021/0021231 A1* | 1/2021 | Yoshida | H01G 9/2081 |

FOREIGN PATENT DOCUMENTS

| WO | 00/31596 A1 | 6/2000 | |
| WO | WO-2019188433 A1 * | 10/2019 | H01G 9/2081 |

OTHER PUBLICATIONS

International Search Report issued in corresponding International Patent Application No. PCT/JP2021/018729, dated Jun. 29, 2021, with English translation.

* cited by examiner

*Primary Examiner* — Kourtney R S Carlson
(74) *Attorney, Agent, or Firm* — Rimon P.C.

(57) ABSTRACT

To provide a solar cell capable of being connected to a substrate using an FPC connector. A solar cell includes: a power generation layer formed on a surface of a base film; a sealing resin layer covering the power generation layer; a protective insulating layer covering an invalid area of the power generation layer; and terminal electrodes provided at positions overlapping the invalid area and at which voltage generated by a valid area of the power generation layer appears. With this configuration, even if cracks occur in the power generation layer upon connection to an FPC connector, the valid area will not be broken. In addition, the invalid area is covered with the protective insulating layer having an elasticity higher than that of the sealing resin layer, so that shock upon connection to the FPC connector is mitigated.

8 Claims, 6 Drawing Sheets

SOLAR CELL AND ELECTRONIC DEVICE HAVING THE SAME

CROSS REFERENCE TO RELATED APPLICATIONS

This application is the U.S. National Phase under 35 U.S.C. § 371 of International Application No. PCT/JP2021/018729, filed on May 18, 2021, which claims the benefit of Japanese Application No. 2020-126586, filed on Jul. 27, 2020, the entire contents of each are hereby incorporated by reference.

TECHNICAL FIELD

The present invention relates to a solar cell and an electronic device having the same and, more particularly, to a flexible solar cell and an electronic device having the same.

BACKGROUND ART

A flexible solar cell is hard to connect to a substrate by means of soldering in terms of heat resistance. Thus, as described in Patent Document 1, a spring probe having elasticity is sometimes used to connect the flexible solar cell to a substrate.

CITATION LIST

Patent Document

[Patent Document 1] International Publication WO 00/031596

SUMMARY OF THE INVENTION

Problem to be Solved by the Invention

However, connection using the spring probe is complicate in structure, so that not only assembly takes time, but also design flexibility of a housing is reduced. To simply connect a flexible solar cell and a substrate, a method of using an FPC (Flexible Printed Connector) is conceivable; however, this may bring about a reduction in power generation amount due to covering of a power generation layer with the FPC connector. Further, cracks may occur in the power generation layer due to shock at insertion of the solar cell into the FPC connector or shock at locking of the FPC connector that has been inserted with the solar cell, which may cause internal short-circuit within the power generation layer.

An object of the present invention is therefore to, in a solar cell capable of being connected to a substrate using an FPC connector, prevent a reduction in power generation amount and prevent internal short-circuit within a power generation layer caused due to shock at the connection of the solar cell to the FPC connector. Another object of the present invention is to provide an electronic device having such a solar cell.

Means for Solving the Problem

A solar cell according to the present invention includes: a flexible base film; a first power generation layer formed on one surface of the base film, configured to photoelectric convert incident light, and having a valid area contributing to power generation; a first sealing resin layer covering at least the valid area of the first power generation layer; a first protective insulating layer covering, out of the one surface of the base film, at least a part of an invalid portion that is not covered with the valid area of the first power generation layer and having an elasticity higher than that of the first sealing resin layer; and a first terminal electrode provided at a position overlapping the invalid portion of the one surface of the base film and electrically connected to the valid area of the first power generation layer.

According to the present invention, the first terminal electrode overlaps the invalid portion of the base film, so that even if cracks occur in the first power generation layer upon connection to an FPC connector, the valid area will not be broken. In addition, at least a part of the invalid portion of the base film is covered with the first protective insulating layer having an elasticity higher than that of the first sealing resin layer, so that shock upon connection to the FPC connector is mitigated.

In the present invention, the first power generation layer may be divided into the valid area and an invalid area not contributing to power generation. The division of the first power generation layer into the valid and invalid areas may be achieved by partly removing the first power generation layer by means of laser light irradiation or the like.

In the present invention, the valid area of the first power generation layer may have a recessed shape portion in a plan view, and the invalid area of the first power generation layer may be positioned so as to be surrounded by the recessed shape portion. With this configuration, it is possible to sufficiently ensure the area of the valid area occupying a mounting area.

In the present invention, the base film may have a through hole. The valid area of the first power generation layer may be provided so as to surround the through hole, and the invalid area of the first power generation layer may be configured to be bent in the through hole. With this configuration, the FPC connector can be connected to a part of the solar cell different from the outer peripheral portion thereof.

The solar cell according to the present invention further includes: a second power generation layer formed on the other surface of the base film, configured to photoelectric convert incident light, and having a valid area contributing to power generation; a second sealing resin layer covering at least the valid area of the second power generation layer; a second protective insulating layer covering, out of the other surface of the base film, at least a part of an invalid portion that is not covered with the valid area of the second power generation layer and having an elasticity higher than that of the second sealing resin layer; and a second terminal electrode provided at a position overlapping the invalid portion of the other surface of the base film and electrically connected to the valid area of the second power generation layer. This allows power generation to be achieved by light incident from both sides of the base film.

In the present invention, the elasticity of the protective insulating layer may be 0.5 G or more and 12 G or less. Using the protective insulating layer having an elasticity falling within the above range allows mechanical shock applied to the solar cell to be sufficiently mitigated.

An electronic device according to the present invention includes: a substrate; an FPC connector mounted on the substrate; and a solar cell connected to the FPC connector. The solar cell includes: a flexible base film; a power generation layer formed on one surface of the base film, configured to photoelectric convert incident light, and having a valid area contributing to power generation; a sealing resin layer covering at least the valid area of the power generation layer; a protective insulating layer covering, out of the one surface of the base film, at least a part of an invalid portion that is not covered with the valid area of the power generation layer and having an elasticity higher than that of the sealing resin layer; and a terminal electrode provided at a position overlapping the invalid portion of the one surface of the base film and electrically connected to the valid area of the power generation layer. At least a part of the invalid portion of the solar cell is inserted into the FPC connector, whereby the terminal electrode of the solar cell is connected to the substrate through the FPC connector.

According to the present invention, the terminal electrode overlaps the invalid portion of the solar cell, so that even if cracks occur in the power generation layer upon connection of the solar cell to the FPC connector, the valid area will not be broken. In addition, at least a part of the invalid portion is covered with the protective insulating layer having an elasticity higher than that of the sealing resin layer, so that shock upon connection to the FPC connector is mitigated.

In the present invention, the gap in a plan view between the FPC connector and the edge of the protective insulating layer covering the valid area of the power generation layer may be larger than the height of the FPC connector from the power generation layer. With this configuration, light obliquely incident on the solar cell is not shielded by the FPC connector but mostly enters the valid area of the power generation layer.

Advantageous Effects of the Invention

As described above, according to the present invention, in a solar cell capable of being connected to a substrate using an FPC connector and an electronic device having the solar cell, it is possible to prevent a reduction in power generation amount and internal short circuiting within a power generation layer caused due to shock at the connection to the FPC connector.

BRIEF DESCRIPTION OF THE DRAWINGS

FIG. 1A is a schematic plan view, and FIG. 1B is a schematic cross-sectional view taken along the line A-A in FIG. 1A.

FIG. 8A is a schematic plan view, and FIG. 8B is a schematic cross-sectional view taken along the line B-B in FIG. 8A.

MODE FOR CARRYING OUT THE INVENTION

Hereinafter, preferred embodiments of the present invention will be described in detail with reference to the accompanying drawings.

Figure 1A:
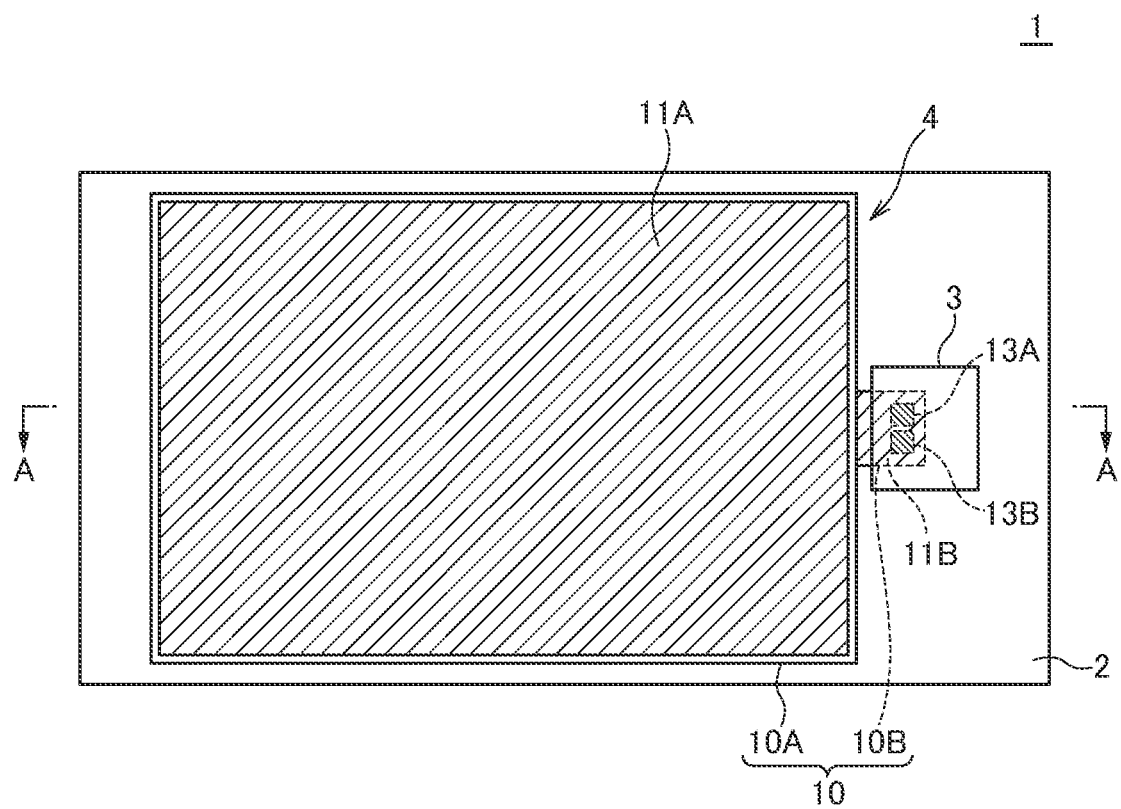
FIGS. 1A and 1B are views for explaining the structure of an electronic device 1 according to a first embodiment of the present invention, where
Figure 1B:
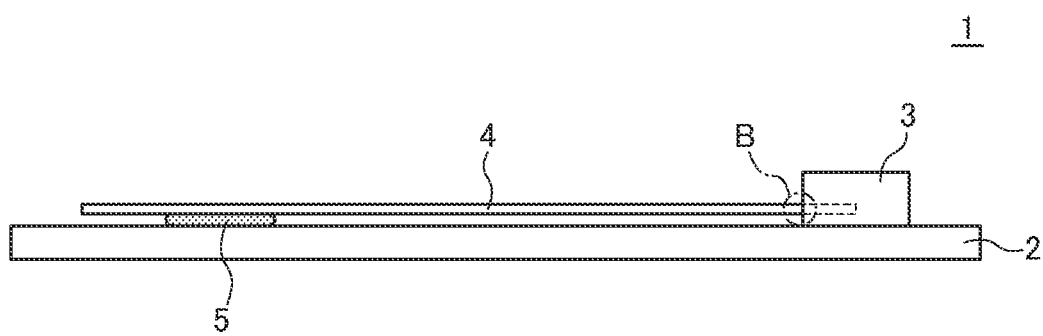
Figure 2:
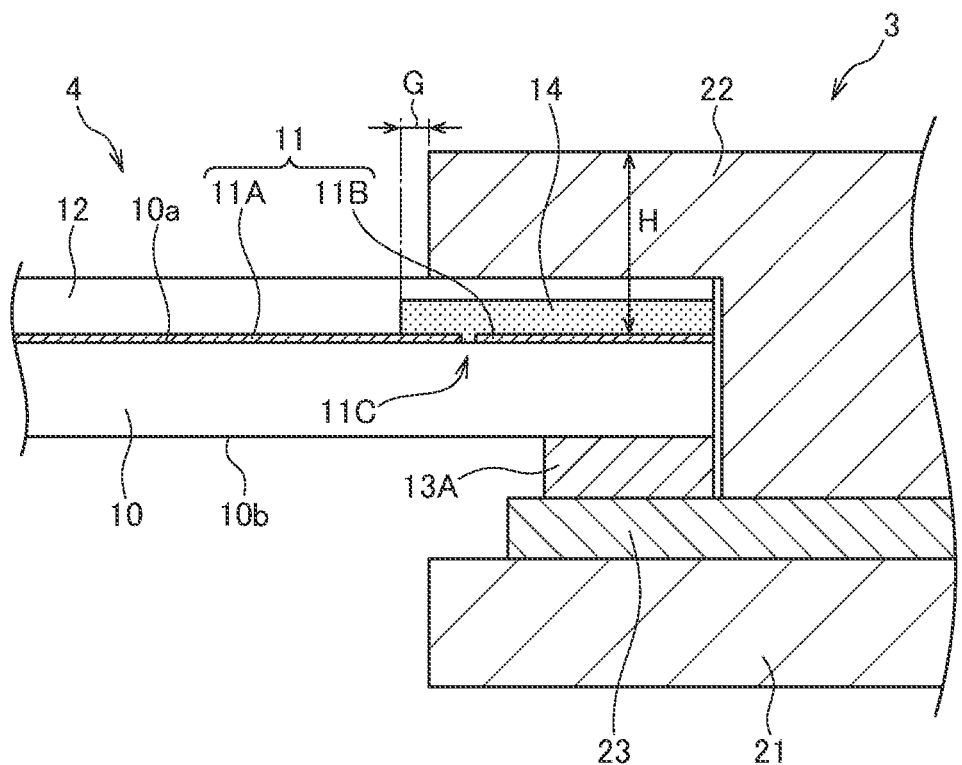
FIG. 2 is a schematic cross-sectional view illustrating, in an enlarged manner, an area B illustrated in FIG. 1B.

FIG. 1 is a view for explaining the structure of an electronic device 1 according to a first embodiment of the present invention, where FIG. 1A is a schematic plan view, and FIG. 1B is a schematic cross-sectional view taken along the line A-A in FIG. 1A. FIG. 2 is a schematic cross-sectional view illustrating, in an enlarged manner, an area B illustrated in FIG. 1B.

As illustrated in FIGS. 1A, 1B, and 2, the electronic device 1 according to the present embodiment includes a substrate 2, an FPC connector 3 mounted on the substrate 2, and a flexible solar cell 4 connected to the FPC connector 3. The solar cell 4 is bonded to the substrate 2 using a double-sided tape 5 or the like. The electronic device 1 is not particularly limited in type and may be a solar-powered watch/clock or a solar-powered beacon.

The solar cell 4 includes a flexible base film 10 made of polyethylene naphthalate or the like, a flexible power generation layer 11 formed on a surface 10a of the base film 10, and a sealing resin layer 12 covering the power generation layer 11. The power generation layer 11 is a semiconductor element that photoelectric converts light incident thereon through the sealing resin layer 12, and voltage generated by the power generation layer 11 appears at a pair of terminal electrodes 13A and 13B provided on a back surface 10b of the base film 10. The voltage appearing at the terminal electrodes 13A and 13B is supplied to a not-shown electronic circuit provided on the substrate 2 through a terminal electrode 23 provided in the FPC connector 3. The sealing resin layer 12 is a passivation film for protecting the power generation layer 11.

The power generation layer 11 is divided into a valid area 11A contributing to power generation and an invalid area 11B not contributing to power generation. A part of the surface of the base film 10 that is not covered with the valid area 11A constitutes an invalid part. The valid area 11A is connected to the terminal electrodes 13A and 13B, while the invalid area 11B is not connected to the terminal electrodes 13A and 13B. The valid area 11A and invalid area 11B may physically be separated by a slit 11C which is formed by partly removing the power generation layer 11 by means of laser light irradiation. In this case, electromotive force is generated also in the invalid area 11B; however, since the invalid area 11B is not connected to the terminal electrodes 13A and 13B, it does not contribute to power generation. The terminal electrodes 13A and 13B are provided at positions overlapping the invalid area 11B in a plan view. The removal of the power generation layer 11 by means of laser light irradiation is preferably applied also to the outer peripheral portion of the valid area 11A. This prevents the valid area 11A from being exposed from the edge of the base film 10, making it possible to increase reliability. On the other hand, the outer peripheral portion of the invalid area 11B need not be removed.

As illustrated in FIG. 2, the edges of the respective invalid and valid areas 11B and 11A are covered with a protective insulating layer 14. The protective insulating layer 14 is made of an insulating material different from that of the sealing resin layer 12 and at least having an elasticity higher than that of the sealing resin layer 12. The elasticity of the protective insulating layer 14 is 0.5 G or more and 12 G or less, and the elasticity of the sealing resin layer 12 is less than that of the protective insulating layer 14. Using the protective insulating layer 14 having an elasticity falling within the above range allows mechanical shock applied to the solar cell 4 to be sufficiently mitigated. The protective insulating layer 14 may cover the entire surface of the invalid area 11B or selectively cover a part of the invalid area 11B that overlaps the terminal electrodes 13A and 13B.

In the example illustrated in FIGS. 1A and 1B, the base film 10 has a main body part 10A and a protruding part 10B protruding from the main body part 10A. The valid area 11A is formed in the main body part 10A, and the invalid area 11B is formed in the protruding part 10B. The protruding part 10B is inserted into the FPC connector 3. Thus, a part of the invalid area 11B and the FPC connector 3 overlap each other in a plan view, while a part of the valid area 11A that is not covered with the protective insulating layer 14 does not overlap the FPC connector 3 in a plan view.

The FPC connector 3 has a lower case 21, an upper case 22, and a terminal electrode 23 provided in the lower case 21. The protruding part 10B of the base film 10 is inserted into the FPC connector 3, and a not-shown slider is operated to lock the FPC connector 3 such that the lower case 21 and upper case 22 sandwich the protruding part 10B of the base film 10. As a result, the solar cell 4 is mechanically fixed to the FPC connector 3, and the terminal electrodes 13A and 13B are electrically connected to the terminal electrode 23 of the FPC connector 3.

Upon insertion of the protruding part 10B of the base film 10 into the FPC connector 3, or upon locking of the FPC connector 3 after insertion of the protruding part 10B of the base film 10 into the FPC connector 3, mechanical shock is applied to the solar cell 4, which may cause cracks in the power generation layer 11. However, in the solar cell 4 according to the present embodiment, the power generation layer 11 is divided into the valid area 11A and invalid area 11B, and the invalid area 11B is sandwiched by the FPC connector 3, thus making it possible to prevent the occurrence of cracks in the valid area 11A. In addition, the valid area 11A and invalid area 11B are physically separated from each other by the slit 11C, so that even if cracks occur in the invalid area 11B due to shock, the cracks do not propagate to the valid area 11A. Further, in the present embodiment, the invalid area 11B is covered with the protective insulating layer 14 having high electricity, so that shock itself applied to the invalid area 11B is mitigated.

Furthermore, in the present embodiment, a part of the valid area 11A that is not covered with the protective insulating layer 14 does not overlap the FPC connector 3 in a plan view, so that light at least in the vertical direction is incident on the valid area 11A without being shielded by the FPC connector 3, which also prevents a reduction in power generation amount. A gap G between the FPC connector 3 and the edge of the protective insulating layer 14 in a plan view is preferably as small as possible and is specifically about 0.3 mm. Obliquely incident light may be shielded by the FPC connector 3 depending on incident angle; however, by appropriately designing the gap G between the FPC connector 3 and the edge of the protective insulating layer 14 in a plan view according to incident angle assumed from the shape or structure of a housing in which the electronic device 1 according to the present embodiment is housed, a reduction in power generation amount can be prevented. The length of shadow generated when light at incident angle θ is shielded by the FPC connector 3 can be represented by H/tan θ, where H is the height of the FPC connector 3 from the power generation layer 11. For example, when the gap G is made larger than the height H, light at an incident angle of 45° or more is incident on a part of the valid area 11A that is not covered with the protective insulating layer 14 without being shielded by the FPC connector 3. That is, when the minimum incident angle assumed from the shape or structure of the housing is 45°, G may be made equal to or more than H (G≥H).

Specifically, assuming that the height H is 2 mm, the size of the gap G may be set as follows: when the assumed minimum incident angle is 45°, the gap G may be made equal to or more than 2 mm; when the assumed minimum incident is 87°, the gap G may be made equal to or more than 0.1 mm; when the assumed minimum incident is 30°, the gap G may be made equal to or more than 3.5 mm; and when the assumed minimum incident is 10°, the gap G may be made equal to or more than 11.3 mm.

As described above, in the electronic device 1 according to the present embodiment, the power generation layer 11 of the solar cell 4 is divided into the valid area 11A and the invalid area 11B, and the terminal electrodes 13A and 13B provided at positions overlapping the invalid area 11B are connected to the FPC connector 3. This prevents the occurrence of cracks in the valid area 11A due to shock upon connection to the FPC connector 3. Besides, since the invalid area 11B is covered with the protective insulating layer 14, shock itself is mitigated. In addition, the FPC connector 3 does not overlap a part of the valid area 11A that is not covered with the protective insulating layer 14, so that incident light is not shielded by the FPC connector 3.

Figure 3:
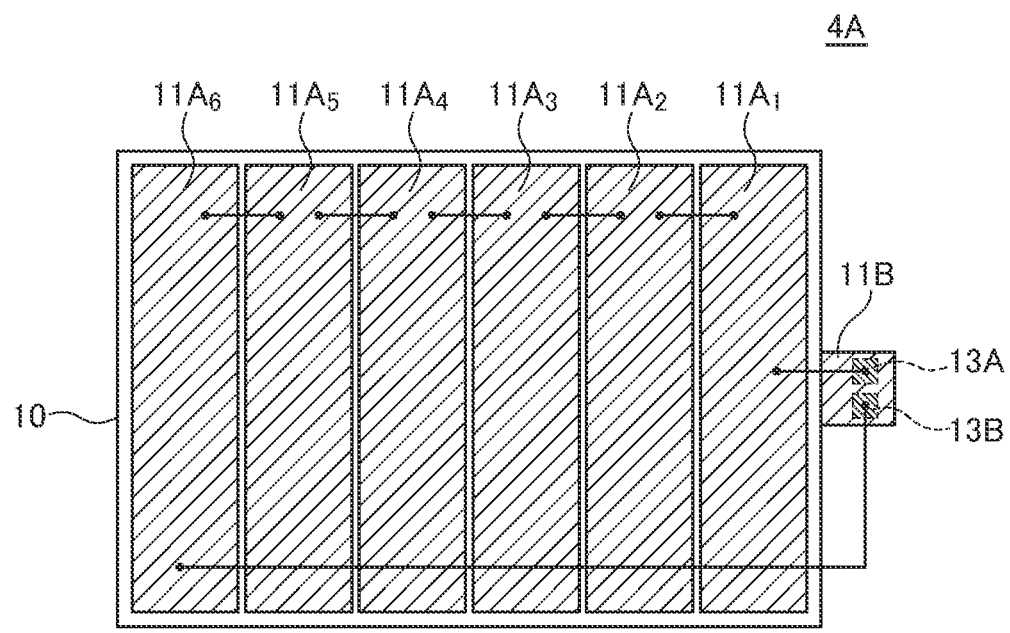
FIG. 3 is a schematic plan view for explaining the structure of a solar cell 4A according to a first modification.

FIG. 3 is a schematic plan view for explaining the structure of a solar cell 4A according to a first modification. The solar cell 4A illustrated in FIG. 3 differs from the above-described solar cell 4 in that the valid area 11A of the power generation layer 11 is divided into six valid areas $11A_1$ to $11A_6$. The six valid areas $11A_1$ to $11A_6$ are connected in series, and one end and the other end of the valid area 11A are connected respectively to the terminal electrodes 13A and 13B. When the valid area 11A is thus divided into a plurality of series-connected areas, higher voltage can be obtained.

Figure 4:
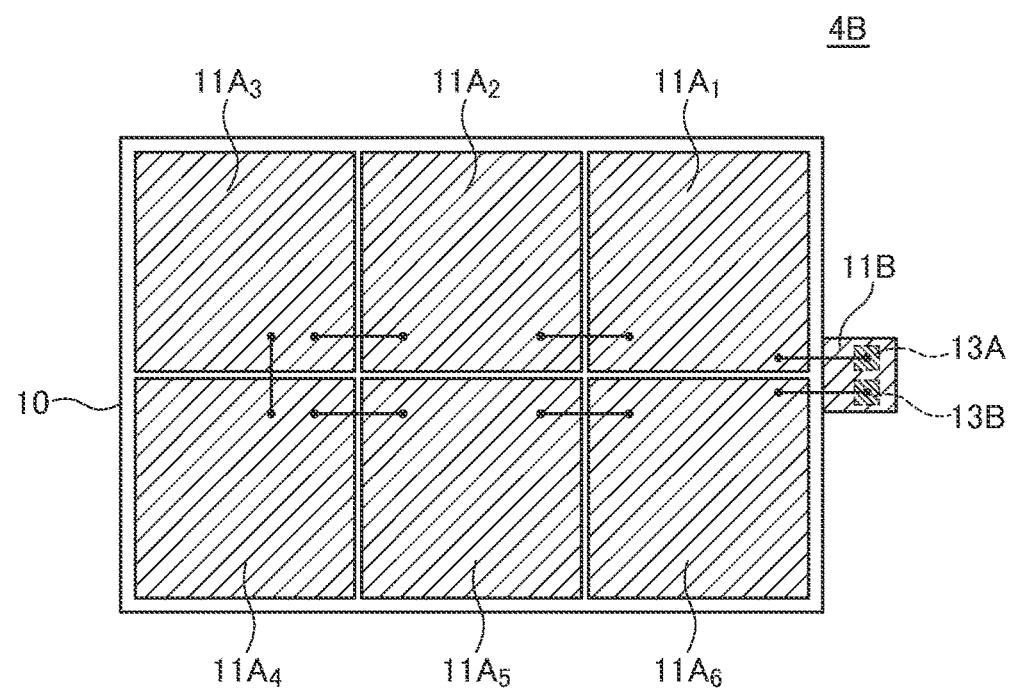
FIG. 4 is a schematic plan view for explaining the structure of a solar cell 4B according to a second modification.

FIG. 4 is a schematic plan view for explaining the structure of a solar cell 4B according to a second modification. The solar cell 4B illustrated in FIG. 4 differs from the solar cell 4A according to the first modification in that the six valid areas $11A_1$ to $11A_6$ are arranged in a matrix form. The six valid areas $11A_1$ to $11A_6$ are connected in series, and one end and the other end of the valid area 11A are connected respectively to the terminal electrodes 13A and 13B. The valid areas $11A_1$ and $11A_6$ connected respectively to the terminal electrodes 13A and 13B are disposed adjacent respectively to the terminal electrodes 13A and 13B, allowing a reduction in wiring resistance.

Figure 5:
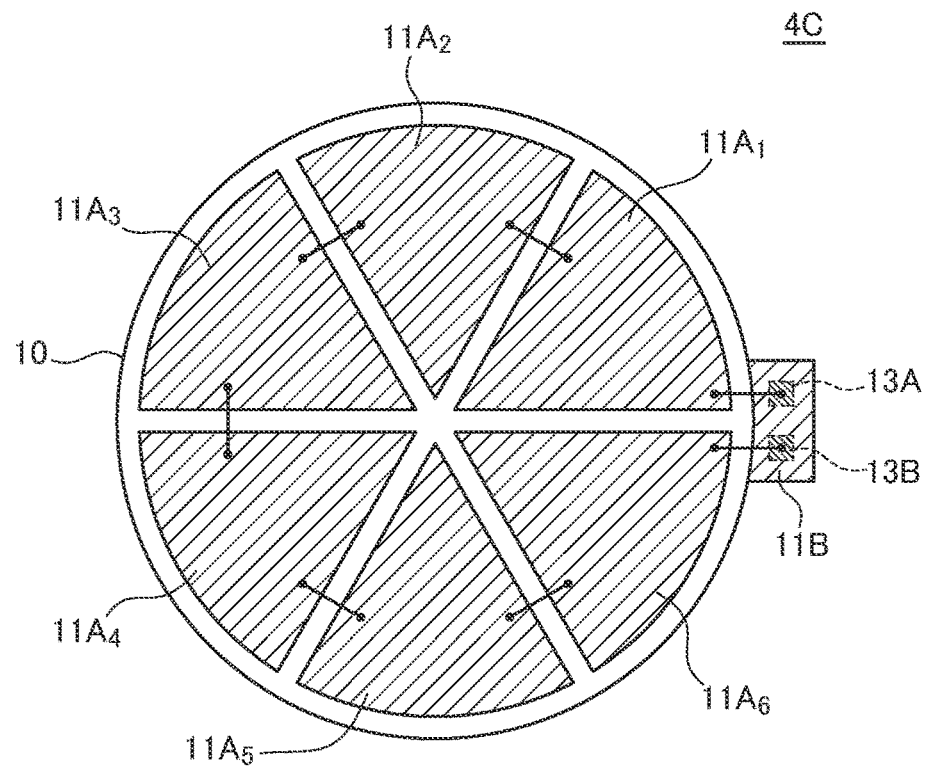
FIG. 5 is a schematic plan view for explaining the structure of a solar cell 4C according to a third modification.

FIG. 5 is a schematic plan view for explaining the structure of a solar cell 4C according to a third modification. The solar cell 4C illustrated in FIG. 5 differs from the solar cell 4B according to the second modification in that the base film 10 has a circular planar shape and that the six valid areas $11A_1$ to $11A_6$ are arranged in the circumferential direction. In the present example as well, the valid areas $11A_1$ and $11A_6$ connected respectively to the terminal electrodes 13A and 13B are disposed adjacent respectively to the terminal electrodes 13A and 13B, allowing a reduction in wiring resistance.

Figure 6:
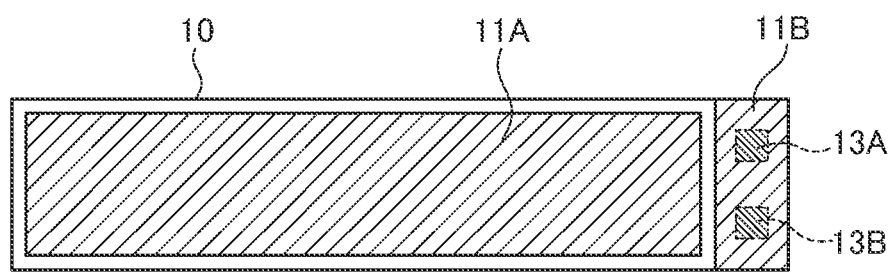
FIG. 6 is a schematic plan view for explaining the structure of a solar cell 4D according to a fourth modification.

FIG. 6 is a schematic plan view for explaining the structure of a solar cell 4D according to a fourth modification. The solar cell 4D illustrated in FIG. 6 differs from the above-described solar cell 4 in that the base film 10 has a rectangular planar shape and does not have the protruding part 10B. Thus, in the present invention, the protruding part 10B for disposing the invalid area 11B in the base film 10 may not necessarily be provided.

Figure 7:
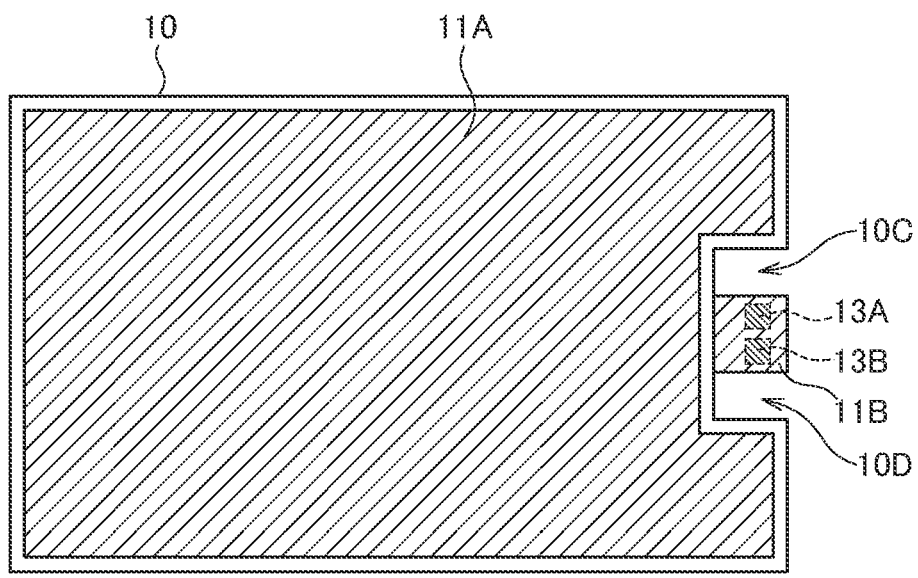
FIG. 7 is a schematic plan view for explaining the structure of a solar cell 4E according to a fifth modification.

FIG. 7 is a schematic plan view for explaining the structure of a solar cell 4E according to a fifth modification. The solar cell 4E illustrated in FIG. 7 differs from the above-described solar cell 4 in that the base film 10 has cut parts 10C and 10D and that the invalid area 11B is provided between the cut parts 10C and 10D. With this configuration, the valid area 11A has a recess-shaped portion in a plan view, and the invalid area 11B is positioned so as to be surrounded by the recess-shaped portion. This allows effective use of the area around the invalid area 11B.

Figure 8A:
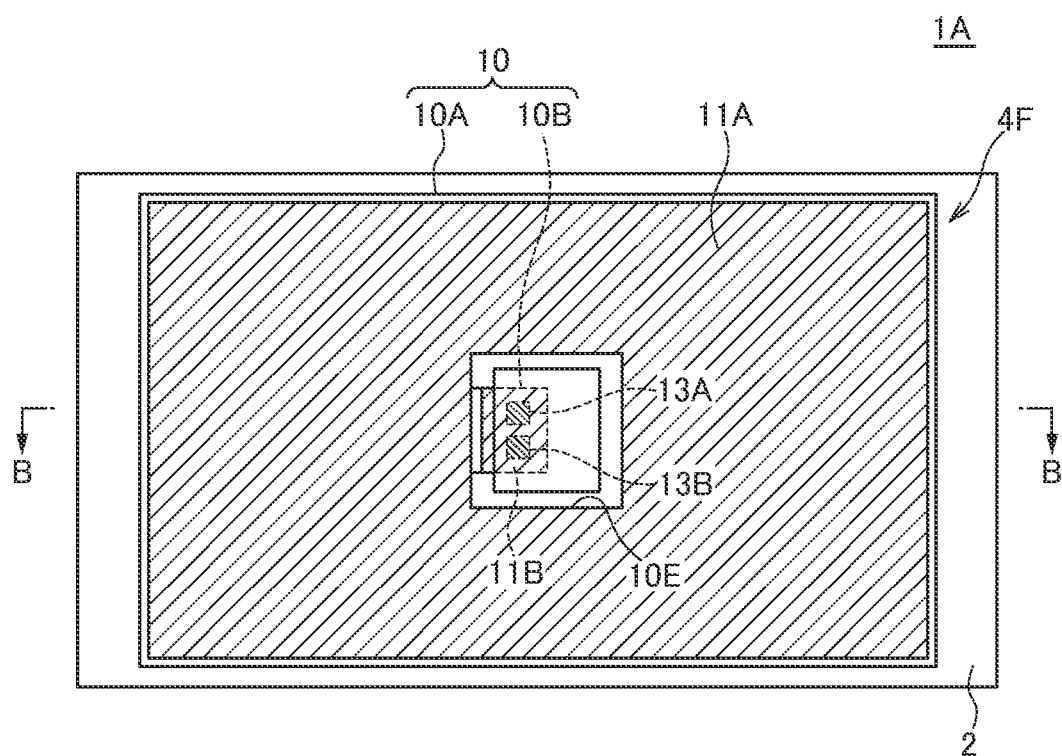
FIGS. 8A and 8B are views for explaining the structure of an electronic device 1A according to a second embodiment of the present invention, where
Figure 8B:
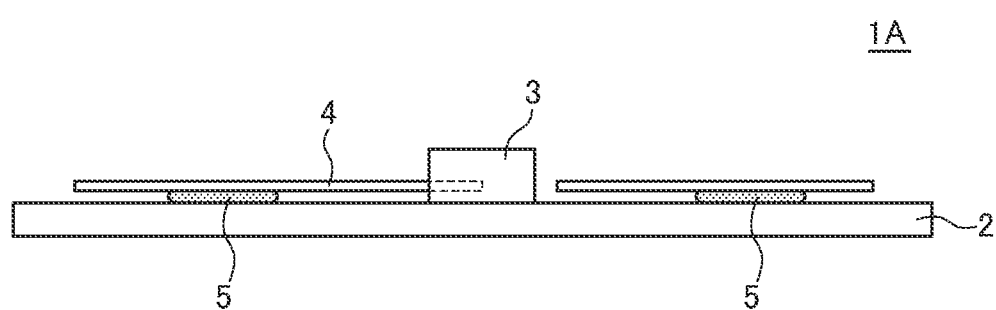

FIG. 8 is a view for explaining the structure of an electronic device 1A according to a second embodiment of the present invention, where FIG. 8A is a schematic plan view, and FIG. 8B is a schematic cross-sectional view taken along the line B-B in FIG. 8A.

As illustrated in FIGS. 8A and 8B, the electronic device 1A according to the present embodiment includes the substrate 2, FPC connector 3 mounted on the substrate 2, and a flexible solar cell 4F connected to the FPC connector 3. The base film 10 constituting the solar cell 4F has a through hole 10E at substantially the center thereof, and the protruding part 10B is positioned in the through hole 10E. The valid area 11A of the power generation layer 11 is provided in the main body part 10A surrounding the through hole 10E. The invalid area 11B and terminal electrodes 13A and 13B are provided in the protruding part 10B, and the invalid area 11B is configured to be bent downward in the through hole 10E. The thus configured invalid area 11B is inserted into the FPC connector 3 while being bent downward, whereby the solar cell 4F and substrate 2 can be electrically connected to each other.

As described above, according to the present embodiment, the FPC connector 3 can be connected to a part of the solar cell 4F different from the outer peripheral portion thereof. Further, the solar cell 4F has a rectangular outer shape, so that when the base film 10 having a large area is cut for taking multiple solar cells 4F, the number of the solar cells 4F can be increased.

Figure 9:
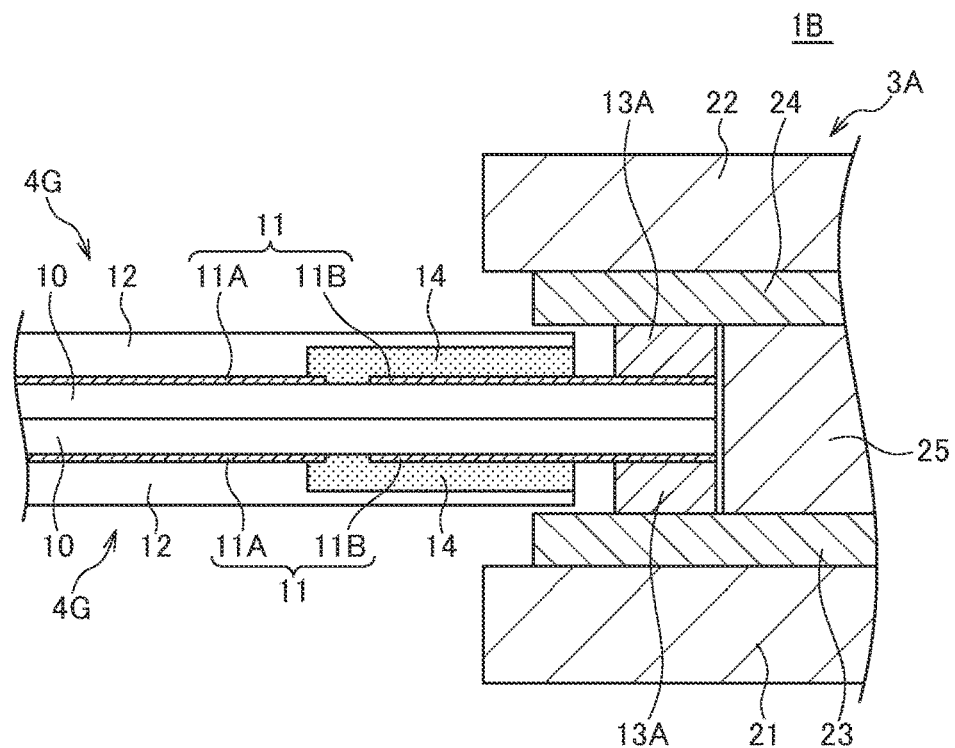
FIG. 9 is a schematic partial cross-sectional view for explaining the structure of an electronic device 1B according to a third embodiment of the present invention, which illustrates a portion corresponding to the area B illustrated in FIG. 1B.

FIG. 9 is a schematic partial cross-sectional view for explaining the structure of an electronic device 1B according to a third embodiment of the present invention, which illustrates a portion corresponding to the area B illustrated in FIG. 1B.

As illustrated in FIG. 9, the electronic device 1B according to the present embodiment has a configuration in which two overlapping solar cells 4G are connected to an FPC connector 3A. Other basic configurations are the same as those of the electronic device 1 according to the first embodiment, so the same reference numerals are given to the same elements, and overlapping description will be omitted.

In each of the solar cells 4G used in the present embodiment, the invalid area 11B of the power generation layer 11 is partly exposed without being covered with the sealing resin layer 12 and protective insulating layer 14, and the terminal electrode 13A (and 13B) is provided at the exposed portion of the invalid area 11B. The two solar cells 4G are made to overlap each other such that the back surfaces of the base films 10 face each other and inserted into the FPC connector 3A in this state. The FPC connector 3A has a terminal electrode 24 provided in the upper case 22. The two overlapping solar cells 4G are inserted into the FPC connector 3A until they abut against a stopper 25, and a not-shown slider is operated to lock the FPC connector 3A such that it sandwiches the base film 10. As a result, the two solar cells 4G are mechanically fixed to the FPC connector 3A and are electrically connected respectively to the terminal electrodes 23 and 24 of the FPC connector 3.

As described above, according to the present embodiment, the two overlapping solar cells 4G are connected to the FPC connector 3A, so that power generation can be achieved by light incident from both sides. In addition, the two solar cells 4G have the same configuration, thus avoiding complicate manufacturing processes.

Figure 10:
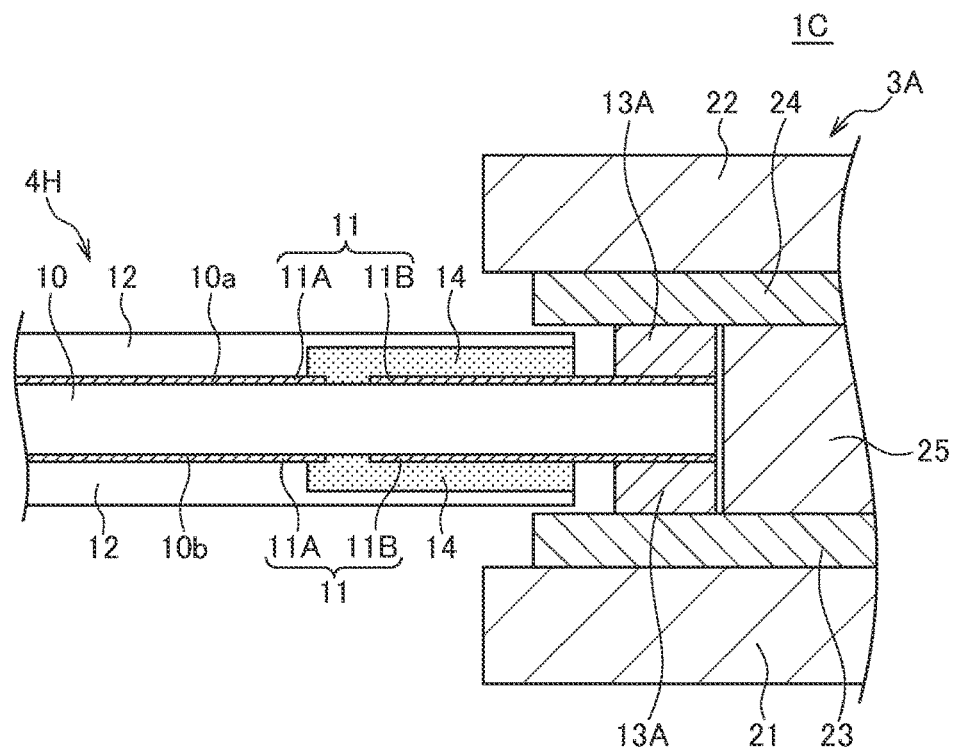
FIG. 10 is a schematic partial cross-sectional view for explaining the structure of an electronic device 1C according to a fourth embodiment of the present invention, which illustrates a portion corresponding to the area B illustrated in FIG. 1B.

FIG. 10 is a schematic partial cross-sectional view for explaining the structure of an electronic device 1C according to a fourth embodiment of the present invention, which illustrates a portion corresponding to the area B illustrated in FIG. 1B.

As illustrated in FIG. 10, the electronic device 1C according to the present embodiment has a configuration in which a solar cell 4H having the power generation layers 11 on both sides thereof respectively is connected to the FPC connector 3A. Other basic configurations are the same as those of the electronic device 1 according to the first embodiment, so the same reference numerals are given to the same elements, and overlapping description will be omitted.

In the solar cell 4H used in the present embodiment, the power generation layers 11 are provided on both surfaces 10a and 10b of the base film 10, respectively. The front and back surfaces of the base film 10 have the same configuration and each have the power generation layer 11, sealing resin layer 12, terminal electrode 13A (and 13B), and protective insulating layer 14. The invalid area 11B is partly exposed without being covered with the sealing resin layer 12 and protective insulating layer 14, and the terminal electrode 13A (and 13B) is provided at the exposed portion of the invalid area 11B.

As described above, according to the present embodiment, the power generation layers 11 are provided on both sides of the base film 10, respectively, so that power generation can be achieved by light incident from both sides. In addition, there is no need to overlap two solar cells, thus avoiding an increase in the number of components.

While the preferred embodiment of the present invention has been described, the present invention is not limited to the above embodiment, and various modifications may be made within the scope of the present invention, and all such modifications are included in the present invention.

For example, although the power generation layer 11 is divided into the valid area 11A and the invalid area 11B in the above embodiments, the invalid area 11B may not necessarily remain, and a portion corresponding to the invalid area 11B may be completely removed.

REFERENCE SIGNS LIST 1, 1A to 1C: Electronic device
2: Substrate 3, 3A: FPC connector
4, 4A to 4H: Solar cell
5: Double sided tape
10: Base film
10a: Base film front surface
10b: Base film back surface
10A: Main body part
10B: Protruding part
10C, 10D: Cut part
10E: Through hole
11: Power generation layer
11A, $11A_1$ to $11A_6$: Valid area
11B: Invalid area
11C: Slit
12: Sealing resin layer
13A, 13B: Terminal electrode
14: Protective insulating layer
21: Lower case
22: Upper case
23, 24: Terminal electrode
25: Stopper

What is claimed is:

1. A solar cell comprising:
a flexible base film;
a first power generation layer formed on one surface of the base film, configured to photoelectric convert incident light, and having a valid area contributing to power generation;
a first sealing resin layer covering at least the valid area of the first power generation layer;
a first protective insulating layer covering, on the one surface of the base film, at least a part of an invalid portion that is not covered with the valid area of the first power generation layer and having an elasticity higher than that of the first sealing resin layer; and
a first terminal electrode provided at a position overlapping the invalid portion of the one surface of the base film and electrically connected to the valid area of the first power generation layer.

2. The solar cell as claimed in claim 1, wherein the first power generation layer is divided into the valid area and an invalid area not contributing to power generation.

3. The solar cell as claimed in claim 2,
wherein the valid area of the first power generation layer has a recessed shape portion in a plan view, and
wherein the invalid area of the first power generation layer is positioned so as to be surrounded by the recessed shape portion.

4. The solar cell as claimed in claim 2,
wherein the base film has a through hole,
wherein the valid area of the first power generation layer is provided so as to surround the through hole, and
wherein the invalid area of the first power generation layer is configured to be bent in the through hole.

5. The solar cell as claimed in claim 1, further comprising:
a second power generation layer formed on other surface of the base film, configured to photoelectric convert incident light, and having a valid area contributing to power generation;
a second sealing resin layer covering at least the valid area of the second power generation layer;
a second protective insulating layer covering, on the other surface of the base film, at least a part of an invalid portion that is not covered with the valid area of the second power generation layer and having an elasticity higher than that of the second sealing resin layer; and
a second terminal electrode provided at a position overlapping the invalid portion of the other surface of the base film and electrically connected to the valid area of the second power generation layer.

6. The solar cell as claimed in claim 1, wherein an elasticity of the protective insulating layer is 0.5 G or more and 12 G or less.

7. An electronic device comprising:
a substrate;
an FPC connector mounted on the substrate; and
a solar cell connected to the FPC connector,
wherein the solar cell includes:
a flexible base film;
a power generation layer formed on one surface of the base film, configured to photoelectric convert incident light, and having a valid area contributing to power generation;
a sealing resin layer covering at least the valid area of the power generation layer;
a protective insulating layer covering, on the one surface of the base film, at least a part of an invalid portion that is not covered with the valid area of the power generation layer and having an elasticity higher than that of the sealing resin layer; and
a terminal electrode provided at a position overlapping the invalid portion of the one surface of the base film and electrically connected to the valid area of the power generation layer, and
wherein at least a part of the invalid portion of the solar cell is inserted into the FPC connector, whereby the terminal electrode of the solar cell is connected to the substrate through the FPC connector.

8. The electronic device as claimed in claim 7, wherein a gap in a plan view between the FPC connector and an edge of the protective insulating layer covering the valid area of the power generation layer is larger than a height of the FPC connector from the power generation layer.

* * * * *